United States Patent [19]

Bakker et al.

[11] Patent Number: 5,005,062

[45] Date of Patent: Apr. 2, 1991

[54] IMAGE SENSOR DEVICE OF THE FRAME TRANSFER TYPE

[75] Inventors: Jacobus G. C. Bakker; Marnix G. Collet, both of Eindhoven, Netherlands

[73] Assignee: U.S. Philips Corporation, New York, N.Y.

[21] Appl. No.: 389,726

[22] Filed: Aug. 4, 1989

[30] Foreign Application Priority Data

Aug. 10, 1988 [FR] France ............... 88 10786

[51] Int. Cl.[5] ............... H01L 29/78; H01L 27/01; H01L 29/00; H01L 27/14
[52] U.S. Cl. ............... 357/24; 357/23.1; 357/30; 357/32
[58] Field of Search ............... 357/24, 23.1, 30, 32

[56] References Cited

U.S. PATENT DOCUMENTS

| 4,618,874 | 10/1986 | Yamada ............... 357/24 LR |
| 4,851,887 | 7/1989 | Hagiwara ............... 357/24 LR |
| 4,851,890 | 7/1989 | Miyatake ............... 357/24 LR |

FOREIGN PATENT DOCUMENTS

| 54-111798 | 1/1979 | Japan ............... 357/24 LR |
| 57-007980 | 1/1982 | Japan ............... 357/24 LR |
| 59-196667 | 11/1984 | Japan ............... 357/24 LR |
| 60-111460 | 6/1985 | Japan ............... 357/24 |
| 61-242667 | 10/1986 | Japan ............... 357/24 LR |

Primary Examiner—Andrew J. James
Assistant Examiner—Daniel Kim
Attorney, Agent, or Firm—Bernard Tiegerman

[57] ABSTRACT

An image sensor device of the frame transfer type comprises a substrate having a first region (10) of a first n type, a second region (12) of the opposite p-type and charge transfer channels (15) as well as an arrangement of electrodes (1A ... 1D) of charge transfer.

A photosensitive layer (50) is arranged on the surface (19) of the substrate and has window regions (100, 200) in electrical contact with the channels (15) through windows (40) provided in the arrangement of electrodes, for example through electrodes (1B, 1D). Insulating strips (24) and conductive strips (30) serve to prevent the drift from one window region to the other of charges to be transferred and to evacuate the charges of a sign opposite to that of the charges to be transferred.

20 Claims, 4 Drawing Sheets

IMAGE SENSOR DEVICE OF THE FRAME TRANSFER TYPE

BACKGROUND OF THE INVENTION

The invention relates to an image sensor device of the frame transfer type comprising a semiconductor substrate having a first region of a first conductivity type, a second region of a second conductivity type opposite to the first conductivity type arranged above the first region of the substrate, parallel charge transfer channels of the first conductivity type arranged in the second region in a direction of charge transfer and an arrangement of charge transfer electrodes perpendicular to the direction of charge transfer provided at the surface of the second region and electrically insulated therefrom in such a manner that they permit, when they are brought to suitable potentials, the transfer of charged of a first sign stored in elementary cells in response to incident light in the direction of charge transfer along the said parallel channels.

Such a device is known from European Pat. No. 143,496 filed by the Applicant.

In this prior art document, the channel regions are photosensitive and consequently only a part of the surface of the device is utilized, which limits the effectiveness.

Otherwise, it has been proposed for image sensor devices of the interline type to provide a photosensitive layer on the whole surface of the crystal and to connect this photosensitive layer electrically pointwise through electrodes to charge accumulation zones. An example of such a sensor is disclosed in European Pat. Application No. 139 366.

The charge transfer is effected, as is usual with this type of image sensor, due to a transfer channel distinct from the charge accumulation zone.

When a photosensitive layer is provided on the whole surface of the crystal, the advantage is obtained that the effectiveness of the device is increased because no geometric factor will reduce the dimensions of the sensitive surface.

However, the structure described is absolutely specific for an image sensor of the interline type (I.L.). In fact, in such sensors, since the charge accumulation zones and the charge transfer channels are mutually separated, the interconnections are formed due to multilayer structures usual in the semiconductor industry.

The invention proposes for an image sensor device of the frame transfer type to provide a photosensitive layer on the surface of the crystal so that its effectiveness is increased.

The structures known hitherto for the sensors of the interline type (I.L.) are, as mentioned above, specific for such sensors. Their use in frame transfer devices would lead to utilizing a substantial part of the surface available for the interposition especially of electrodes connecting the photosensitive layer and charge transfer regions to each other.

SUMMARY OF THE INVENTION

The basic idea or the invention is to provide in the arrangement of electrodes at least one window per elementary cell, through which the photosensitive layer is brought into electrical contact with a charge transfer channel.

For this purpose, the device according to the invention is characterized in that it comprises a photosensitive structure, which covers the arrangement of electrodes and is electrically insulated therefrom, in that the arrangement of electrodes has an arrangement of charge transfer windows, through which at least one window region of the photosensitive structure is for each elementary cell locally in electrical contact with one of the parallel channels, and in that a network of separation strips is superimposed on the arrangement of electrodes and is arranged along the whole outline of the window regions so as to avoid the drift of the charges of the first sign between the window regions (and hence between the elementary cells) and to evacuate the charges of a second sign opposite to the first sign, the said network having conductive strips of the second conductivity type adjoining in at least one direction the window regions of the photosensitive structure.

This structure has several advantages. On the one hand, the charge transfer channels remain spaced apart in the same manner as in the known frame transfer structures. On the other hand, the arrangement of electrodes provided between the parallel channels and the photosensitive layer can be obtained in the same manner as in the case of conventional frame transfer devices, the windows formed in the arrangement of electrodes and having in practice small dimensions otherwise exerting a negligible influence on the distribution of the potential in the change channels. Finally, the separation strips avoid the drift of the charges of the first sign and permit the evacuation of the charges of the second sign.

The arrangement of windows can advantageously be constituted by prolonged parts of the window regions of the photosensitive layer. Thus, the manufacture is simpler and it is not necessary to provide especially contact electrodes, as in the devices of the interline type.

According to a first variation, the arrangement of windows comprises per elementary cell at least one window provided through at least one electrode of the arrangement of electrodes.

According to a particularly advantageous embodiment of this variation, the image sensor device is of the interlacing type and the arrangement of electrodes has two windows for each elementary cell, which are located on two charge transfer electrodes which are not adjacent to each other and are mutually separated by at least one charge transfer electrode.

According to a second variation, the arrangement arrangement of windows has strips parallel to the charge transfer electrodes of the arrangement of electrodes, each strip of the arrangement of windows being disposed in a space between two charge transfer electrodes and the said strips being interrupted between the elementary cells by the separation strips, which are parallel to the charge transfer direction.

The photosensitive structure is advantageously constituted by a layer of doped recrystallized Si, the substrate also consisting of Si. The layer of doped recrystallized Si is of the first conductivity type, for example the n-type, and the prolonged parts also consisting of doped recrystallized Si are of the first conductivity type and have the same doping, for example an n-type doping of $5 \cdot 10^{15}$ atoms/cm$^3$ for charge transfer channels having a doping lying between 1 and $4 \cdot 10^{16}$ at/cm$^3$.

The layer of doped recrystallized Si may be of the first conductivity type, for example p-doped at $5 \cdot 10^{15}$ at/cm$^3$ and the prolonged parts may also consist of doped recrystallized Si of the second conductivity type, but may have a higher doping, for example, a p-type doping of $2 \cdot 10^{16}$ at/cm$^3$ for charge transfer channels of the n-type having a doping lying between 1 and $4 \cdot 10^{16}$ at/cm$^3$. In the latter case, the higher doping of the prolonged parts nerves to avoid that they are completely depleted of charges.

A problem of the charge-coupled image sensor device is that o image smear, which is due to an undesired transfer to the charge transfer channels of the charges which are generated at the frame transfer stage in the window regions receiving a high luminous intensity. A manifestation of this phenomenon is, for example, that a luminous spot isolated in a dark background is reproduced in the image with a streak in the direction of charge transfer. This phenomenon must not be confused with the flux due to "blooming", which localized phenomenon is due to an excess of the generated charges at the integration stage.

The basic idea of the invention of solving this problem is to arrange electrodes intended to be brought to a potential of the second sign, for example the positive sign, at the frame transfer stage so as to sense the charges of the first sign, in this example the electrons generated at the charge transfer stage.

According to a first embodiment, the image smear can be suppressed at least for the major part due to the fact that at least one upper electrode insulated from the charge transfer electrodes and intended to be brought to a first potential of the first sign at an image integration stage and to a second potential of the second sign at a charge transfer stage is superimposed on the arrangement of charge transfer electrodes.

According to a first advantageous variation of this first embodiment, the said upper electrode is reflective. Thus, the suppression of image smear is improved because only a small quantity of incident luminous radiation can reach the charge transfer channels. Without this measure, especially the red spectrum could directly reach the charge transfer channels and could generate therein electron-hole pairs, which is particularly undesirable at the charge transfer stage.

According to a second advantageous variation of this first embodiment, non-transparent islands having dimensions considerably larger than those of the windows are arranged at the surface of the photosensitive structure and at right angles to the windows. Consequently, a quasi total suppression of the smear phenomenon is obtained at the expense of an occupation of a small part of the photosensitive surface.

According to a second embodiment, the image smear can be suppressed at least for the major part due to the fact that a transparent electrode is arranged on at least a part of the surface of the photosensitive structure and is electrically insulated therefrom, this transparent electrode being intended to be brought to a first potential of the first sign at an image integration stage and to a second potential of the second sign at a charge transfer stage.

According to an advantageous variation of this second embodiment, the charge transfer electrodes are reflective. Thus, only a small part of the incident luminous radiation can reach the charge transfer channels.

According to another variation of this second embodiment, the image smear is practically suppressed due to the fact that for each window region a conductive reflecting region is arranged in electrical contact with the photosensitive structure between the photosensitive structure and the arrangement of electrodes so as to be electrically insulated from the latter, the conductive regions being mutually separated along a network of insulating separation strips, at right angles to which reflecting lines can be arranged, which are disposed, for example, under the separation strips and are embedded in an insulating material.

Thus, a quasi total suppression of the smear phenomenon is obtained without occupation of any part of the photosensitive surface, but at the expense of a relative complication of the manufacture.

According to a third embodiment more particularly suitable for the second variation of the arrangement of windows, preferably non-transparent electrode strips are arranged at right angles to the strips of the arrangement of windows.

BRIEF DESCRIPTION OF THE DRAWINGS

The invention will be understood more clearly when reading the following description, given by way of non-limitative example, with reference to the drawings, in which.

DETAILED DESCRIPTION OF THE PREFERRED EMBODIMENTS

Figure 1A:
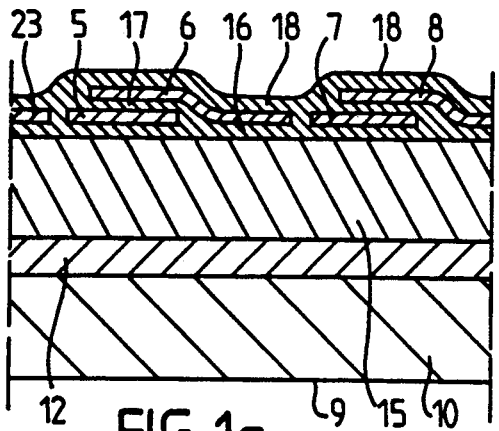
FIG. 1a and FIG. 1b show a frame transfer image sensor according to the prior art in sectional view taken on the axis of a channel and at right angles to the channels, respectively.
Figure 1B:
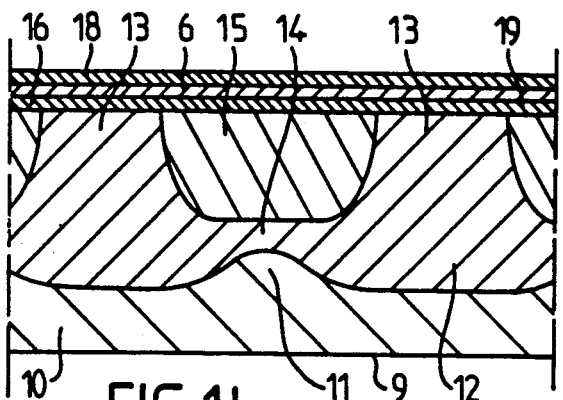

According to FIGS. 1a and 1b, a prior art image sensor device of the frame transfer type comprises a substrate having a region 10 of the n$^-$ type having a doping between $2 \cdot 10^{14}$ and $8 \cdot 10^{14}$ at/cm$^3$, and a region 12 of the p$^-$ type having a doping between 1 and $5 \cdot 10^{15}$ at/cm$^3$ arranged above the region 10 and extending to the upper surface 19 of the substrate. Longitudinal channels 15 of the n-type having a doping between $10^{16}$ and $4 \cdot 10^{16}$ at/cm$^3$ are diffused or implanted from the upper surface 19 of the substrate to a depth of about $1/\mu$m. The channels 15 not only serve to realize a transfer of charges, but also constitute the photosensitive regions of the image sensor. The portions 13 of the region 12 situated between the channels 15 are generally more strongly doped than the remaining part of the region 12 ($2 \cdot 10^{16}$–$10^{18}$ at/cm$^3$) so as to constitute effective channel interruption zones suitable to prevent the drift of charges from one channel to the adjacent channels. Finally, an arrangement of electrodes comprising repetitive patterns of electrodes 5 to 8 of polysilicon, which are transparent and perpendicular to the channels 15, for a conventional four-phase device of the interlacing type is obtained on the upper surface of the substrate, electrodes being insulated from each other by insulating layers 16, 17 and 18 of SiO$_2$.

Moreover and in the case in which a correction of the blooming effect is desired, the region 10 has a longitudinal profile 11 curved upwards under the channels 15 so as to make the region 12 thinner at 14, which permits the excess of charges produced in the case of luminous overintensity of being evacuated in the region 10.

The region 12 can be obtained by diffusion, implantation or epitaxy, while the longitudinal profiles 11 can be formed from the upper surface of the substrate through a mask comprising strips after diffusion or implantation of the regions 12.

The operation of such an image sensor will be described briefly. During the period of integration, electron-hole pairs are produced in the photosensitive channels 15 by the incident light. During the frame transfer period, the electrons thus produced are transferred stepwise along the channels 15 until the whole frame has been transferred. This is obtained by the adequate clocked polarization of the electrodes 20 to 23.

In such a device, the effectiveness is limited by the fact that the light must traverse the arrangement of electrodes and the oxide layers and by the fact that the channel interruption zones 13 have an attenuated sensitivity when they are highly doped.

According to the invention, the arrangement of electrodes disposed at the upper surface 19 is covered by a photosensitive layer 50 and windows 40 are provided to ensure an electrical continuity between the layer 50 and the channels 15 which fulfil only a charge transfer function. The upper surface of the device is thus occupied by the photosensitive surface exclusive of narrow conductive strips 30, which serve to evacuate the holes of the electronhole pairs.

Figure 2:
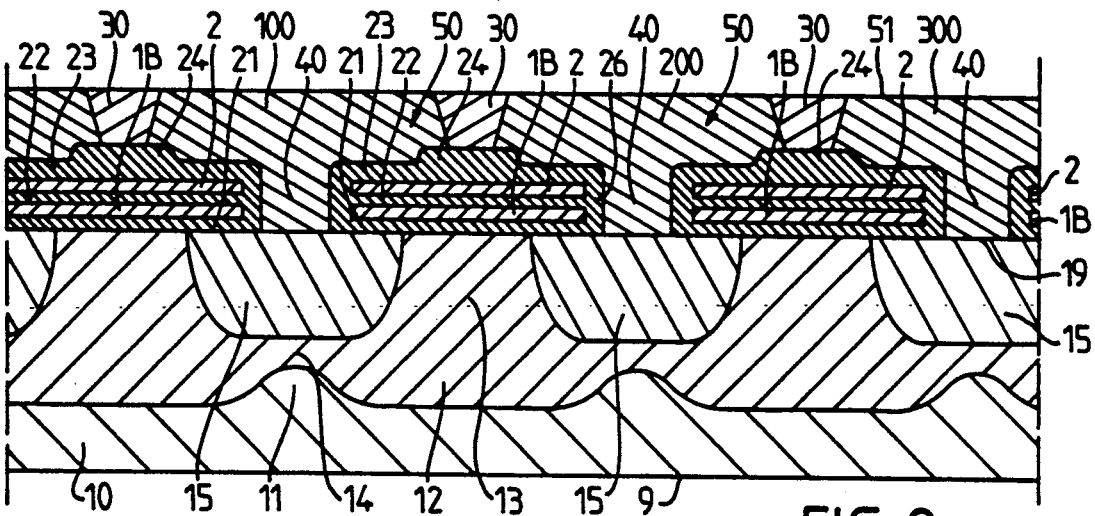
FIGS. 2 and 3 show two variations of an image sensor according to the invention in sectional view at right angles to the channels, FIG. 4 being a sectional view of FIG. 3 taken on the axis of a channel.

More particularly, in FIG. 2, the substrate comprises in the same manner as described above the regions 10, 12, 13 and, as the case may be, 11 and 14 as well as the channels 15. The arrangement of electrodes has windows 40, i.e. at least one per elementary cell, through which the electrical continuity of the window regions (100, 200) of the photoconductive region 50 is ensured with the channels 15 by prolonged parts of the regions 50. By way of example and for the dopings of the substrate, such as given above by way of example, the region 50 and its prolonged parts 40 may be made of recrystallized Si of the n-type having a doping of $5 \cdot 10^{15}$ at/cm$^3$, or they may both be made of recrystallized Si of the p-type, the region 50 being doped at $5 \cdot 10^{15}$ at/cm$^3$ and the prolonged parts 40 having a higher doping, i.e. $2 \cdot 10^{16}$ at/cm$^3$, in order to avoid that they are in the fully depleted state. In the latter case, the prolonged parts 40 which are formed after the windows in the oxide have been opened and then the layer 50 is formed on the whole surface, after which the operation of recrystallizing the layer 50 and the prolonged parts 40 is effected.

The arrangement of electrodes comprises for a four-phase device of the interlacing type groups of electrodes 1A, 1B, 1C and 1D perpendicular to the channels 15 and distributed in a repetitive manner along the whole length of the channels 15 and electrically insulated by layers of SiO$_2$ 21, 22 and 23, as is usual for the frame transfer devices. An elementary cell then comprises two window regions (100, 101). The assembly of the arrangement of electrodes can be covered by an electrode 2, which serves to reduce or even to avoid the image smear phenomenon. In other words: the electrode 2 lies on the whole upper surface 19 except the windows 40 and the edges 26 of the oxide layers enclosing it and electrically insulating it from the electrodes.

At the image transfer stage, the electrode 2 is positively polarized. Consequently, the electrons produced at the frame transfer stage are attracted by the electrode 2 and are held by the latter. Thus, for the points for which the luminous intensity is high, it is avoided that the charges produced at the charge transfer stage reach the channels 15 during the charge transfer.

After the charge transfer stage, the electrode 2 is brought to a negative or zero potential and the electrons held before by the electrode 2 are freed and can flow to the channels 15, just like those produced at the integration stage.

Besides, the electrode 2 can be reflective. This permits of avoiding that electrical charges are produced in the substrate, more particularly by the red part of the spectrum susceptible to attaining directly the channels 15.

In order to avoid a drift of charges of the photosensitive layer 50 from one window region to the other, the oxide layer 23 has oxide strips 24 forming a bi-dimensional network and extending one parallel to the channels 15 and the other perpendicular to the latter and defining the perimeter of the window regions (100, 101) of the photosensitive layer 50.

Moreover, since the photons incident upon the layer 50 produce electron-hole pairs, of which the electrons are collected in the n-type channels, the holes are collected by conductive strips 30 arranged at the surface of the layer 50 and extending in at least one direction along the outline of the window regions and adjoining at least one side of each window region.

By way of example, the layer 50 has a thickness of 1.5/$\mu$m, the oxide layers 21, 22 and 23 have thicknesses of 0.1, 0.2 and 0.1 /$\mu$m, respectively, the oxide strips 24 have a thickness of 0.5/$\mu$m and the electrodes 1A to 1D and 2 consist of highly doped silicon having a thickness of 0.3/$\mu$m.

Figure 3:
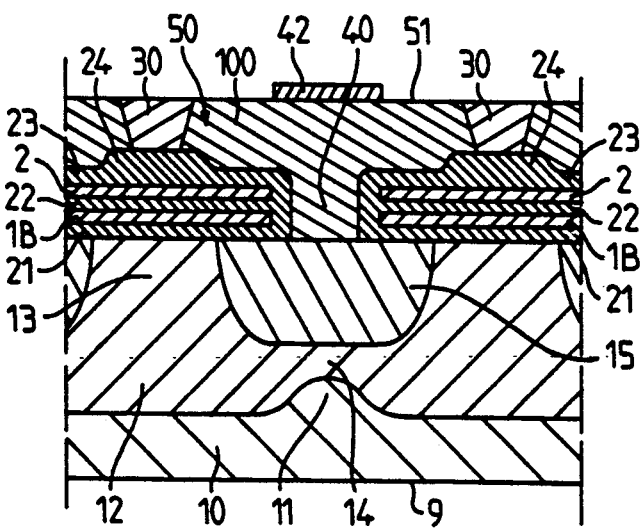

According to FIG. 3, the electrode 2 is reflective and the photosensitive layer 50 has at its surface 51 regions 42 which are non-transparent, that is to say either absorbing or reflecting, perpendicularly above the windows 40 and having dimensions equal to or slightly larger than these windows. The incident radiation is then wholly prevented from reaching directly the channels 15, which results in a quasi total suppression of the image smear.

Figure 4:
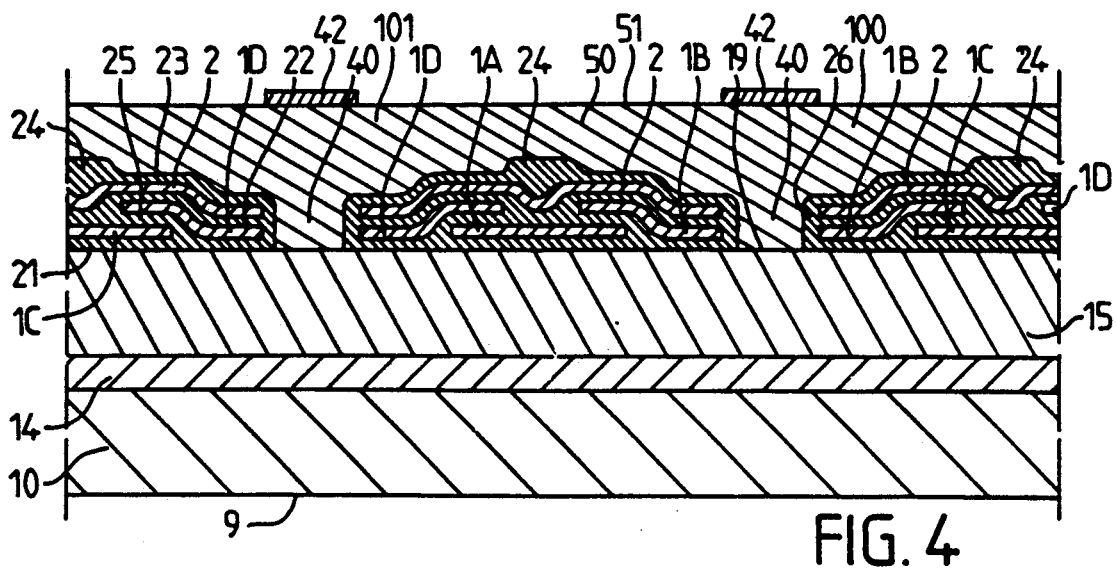

FIG. 4 shows more particularly the arrangement of the electrodes 1A to 1D and 2.

A first level is constituted by the electrodes 1A and 1C insulated from the surface 19 by an insulating layer 21. A second level is constituted by the electrodes 1B and 1D separated from the surface 19 by the insulating layer 21 in their central region which adjoins the windows 40 and whose lateral edges overlap the electrodes 1A and 1C, these lateral edges being electrically insulated from the latter electrodes by an insulating layer 25.

Finally, a third level is constituted by the electrode 2 covering the assembly except the windows 40 and the edges 26 of the oxide layers enclosing completely the windows 40 so as to insulate them from the electrodes 1A to 1D and 2.

Since the function of the windows 40 is simply to permit the passage of the electrons produced in the layer 50 to the channels 15, their dimension is advantageously as small is permitted by the manufacturing method, for example 2/$\mu$m $\times$ 2/$\mu$m for a thickness which is that of the arrangement of electrodes inclusive of the electrodes 2, i.e. 1/$\mu$m in all in the example mentioned above. Thus, it is avoided that the potential produced at the level of the channels 15 by the electrodes 1B and 1D is disturbed.

Moreover, the conductive strips 30, which serve to evacuate charges (holes), may also have a width as small as permitted by the manufacturing method (for example 1 to 2/μm). This width is considerably smaller than that of the channel interruption zones 13, whose width is about 4/μm for a distance between the axes of the channels of the order of 10/μm.

Thus, it appears that the photoconductive surface is considerably larger than in the prior art frame transfer devices. Besides, the effectiveness is higher due to the fact that the incident radiation strikes directly the photosensitive layer 50.

Figure 5:
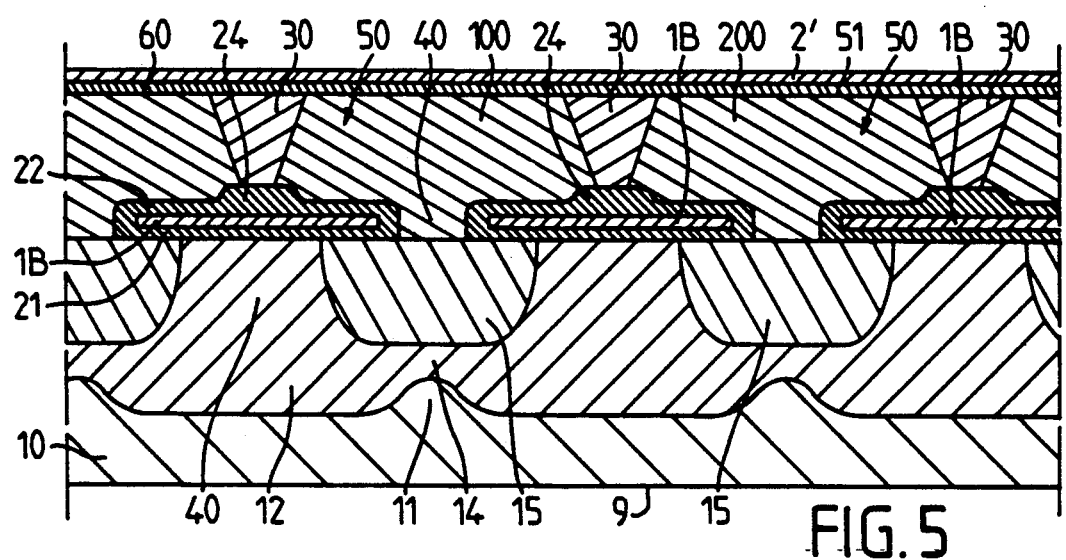
FIGS. 5 and 6 show two other variations of an image sensor according to the invention in sectional view at right angles to the channels.

According to FIG. 5, an electrode 2' fulfilling the same function of correction of image smear as the electrode 2 is transparent and entirely covers the upper surface 51 of the photosensitive layer 50, from which it is separated by an insulating layer 60, for example of $SiO_2$. In order to still further reduce the image smear, the electrodes 1A to 1D are advantageously reflective.

Figure 6:
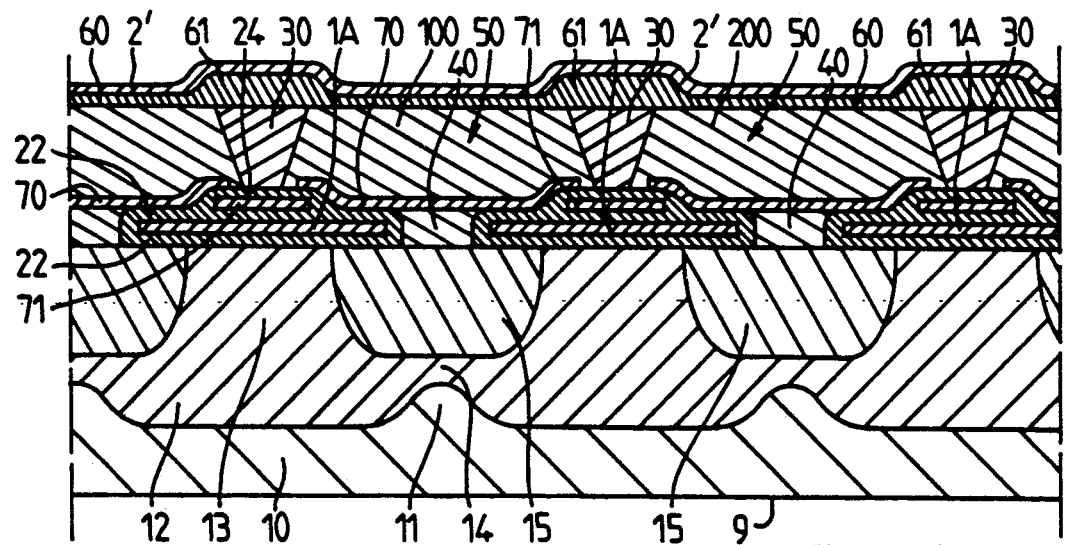

According to FIG. 6, the oxide layer 60 has along the outline of the window regions (100, 101) and projecting therefrom a bi-dimensional network of thicker oxide strips 61. These oxide strips contribute to avoiding a drift of charges on the surface 51 between the window regions (100, 101). These oxide strips may be omitted in the case in which conductive strips 30 are present; the latter also permit of avoiding a drift of charges (electrons) between the window regions.

The correction of image smear is obtained due to conductive and reflective islands 70, for example of Mo or Al, i.e. one for each window region, electrically insulated from each other and extending at the surface of the insulating layer 22 and on the windows 40.

Moreover, a reflective layer 71 forming a bi-dimensional network is advantageously embedded in the insulating strips 24 so as to be arranged at right angles to the zones separating the islands 70 whilst slightly projecting therefrom. The layer 2' permits of holding in the layer 50 the electrons produced at the charge transfer stage and the islands 70 prevent radiation from directly reaching the channels 15, which, although they have only a charge transfer function, have, however, a given photoconductivity. The islands being conductive, the electrons produced in the window regions (100, 101) of the layer 50 normally transit at the integration stage to the channels 15 through the central part of the conductive islands 70 and the windows 40. Finally, the reflective layer 71, which may or may not be conducting, permits of accomplishing the protection of the substrate from the radiation susceptible to reaching it directly.

Figure 7:
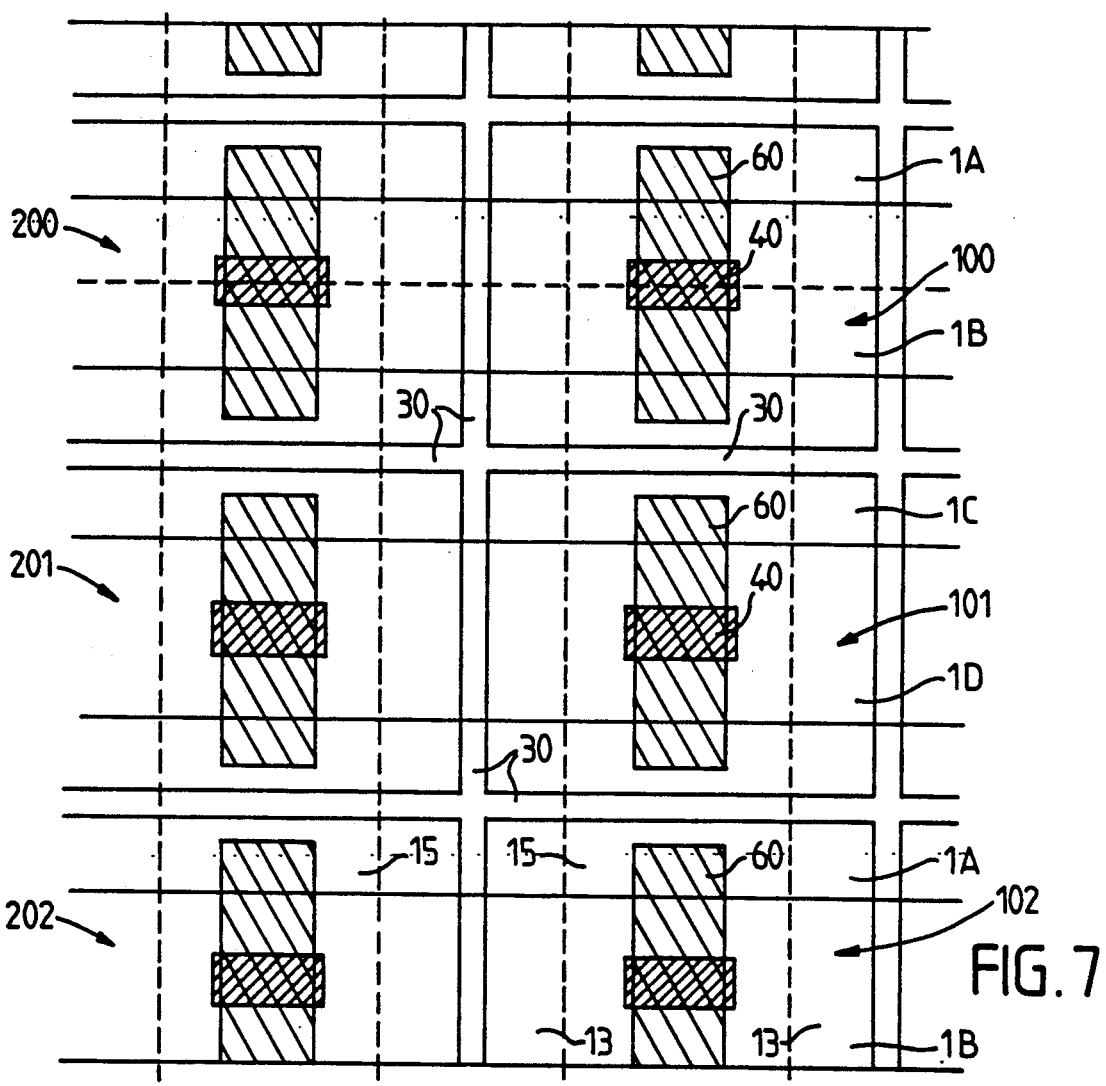
FIG. 7 is a plan view of FIG. 6.

According to FIG. 7, the conductive strips 30 are shown as a bi-dimensional network carrying the whole contour of the window regions (100, 101, 200, 201). It will be appreciated that their function of collecting charges can be fulfilled if the conductive strips adjoin at least one side of each of the window regions. FIG. 7 corresponds to a four-phase system (electrodes 1A to 1D) used for an image of the interlacing type, the arrow indicating the direction of charge transfer. The windows 40 (i.e. two for each elementary cell) are provided only through one out of two electrodes (1B and 1D). The windows 40 and the parts of smaller thickness of the layer 60 have been shown by cross-hatched lines. Each elementary cell comprises two window regions (100, 101) (200, 201) aligned in the direction of charge transfer, i.e. the axis of the channels 15, and each provided with a window 40.

Figure 8:
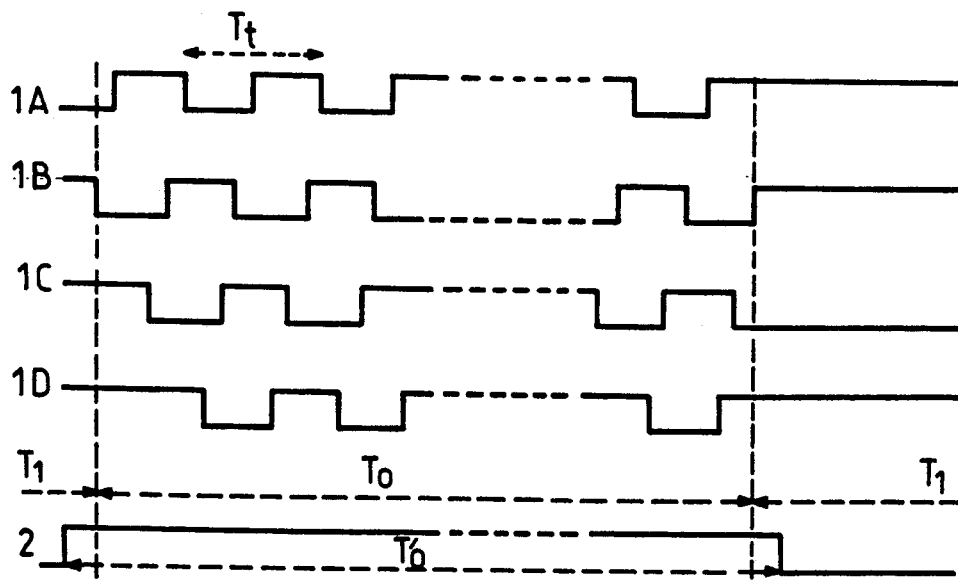
FIG. 8 shows the voltages at the terminals of the electrodes 1A, 1B, 1C, 1D and 2 during a cycle.

FIG. 8 shows an example of the signals of the electrodes 1A to 1D for an integration period $T_1$ and a charge transfer period $T_Q$. The signal applied to the electrode 2 (or 2') is positive during a time interval $T'_0$ elapsing slightly before and after the charge transfer period $T_0$. During the integration period $T_1$, the electrodes 1B and 1D, those which comprise the windows 40, are positive, while the electrodes 1A and 1C have opposite polarities, which are inverted from one integration stage to the next one. In other words: during an integration stage having a duration $T_1$, only one of the electrodes 1A to 1D is brought to a negative potential, i.e. one of the electrodes 1A or 1C, for example 1A. In the next integration cycle, the other of the electrodes 1A or 1C is at a negative potential, i.e. in this example 1C. At the charge transfer stage, the electrodes 1A to 1B are clocked at a transfer frequency (having a period $T_t$) with a phase shift of 90° from one electrode to the adjacent electrode. For example, there is:

$T_0 = 0.24$ ms, $T_1 = 19.76$ ms and $T_t = 800$ ns.

Figure 9:
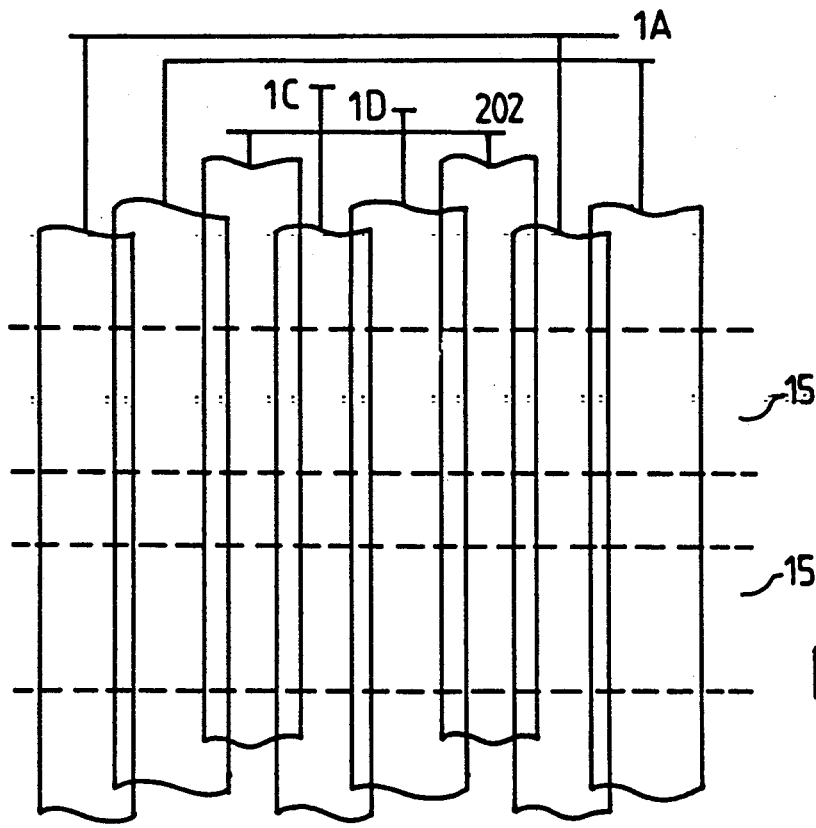
FIG. 9 is a diagrammatic plan view of a preferred embodiment of the invention.
Figure 10A:
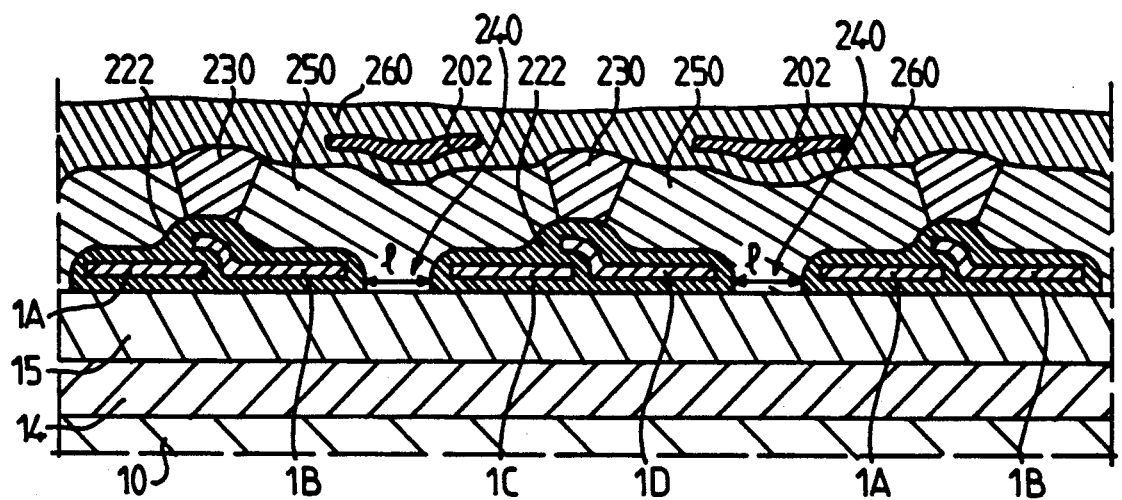
FIGS. 10a and 10b show sectional views at right angles to the axis of the charge transfer electrodes and parallel thereto in a space between electrodes, respectively.
Figure 10B:
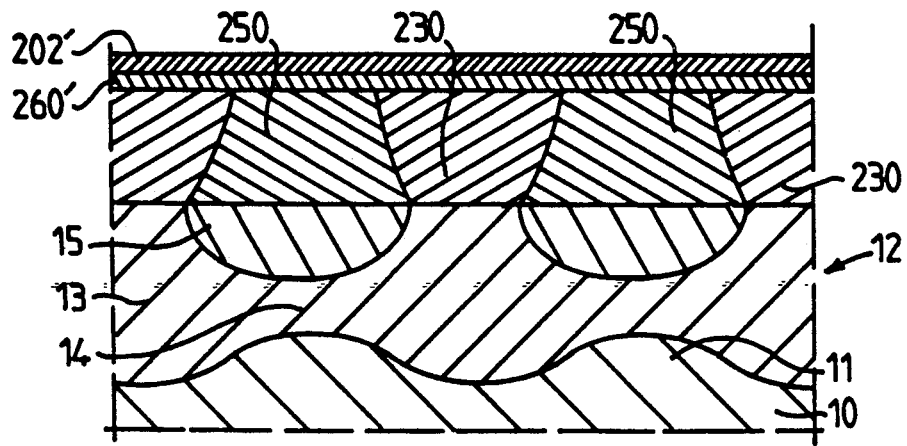

FIGS. 9, 10a and 10b show a preferred embodiment of the invention, which has the property that it can generally be manufactured in a simple manner and permits of ensuring, should the case arise, favourable properties of image smear correction.

As in the preceding Figures, the device has a region 10 of the n$^-$ type which may be provided with longitudinal profiles 11 as well as a region 12 of the p$^-$ type having portions 13 situated between longitudinal channels 15 of the n-type serving to transfer the charges.

The essential difference with the preceding Figures is that windows are no longer opened at the level of each elementary cell, but that strips situated between adjacent electrodes of the charge transfer electrodes (1A to 1D) extend over the whole length of these electrodes and are constituted by prolonged parts of the aforementioned photosensitive layer 250.

FIG. 10a shows such strips 240 extending between groups of two electrodes (1A, 1B) and (1C, 1D), respectively, embedded in an insulating material (222) as well as conductive strips 230 of the p$^+$ type The width 1 of the strips 240 can be as small as permitted by the manufacturing method, i.e. for example 1/μm. They are advantageously non-transparent for an optimum suppression of the image smear. The conductive strips 230 of the p$^+$ type are arranged above the oxide 22 and extend parallel to the charge transfer electrodes (1A to 1D) to the surface of the layer 250 so as to confine the free charge carriers at specific areas. This confinement is completed due to p$^+$ regions 231 forming with the strips 230 a rectangular bi-dimensional network covering the whole surface of the device and locally interrupting the strips 240 at each elementary cell in the direction of charge transfer. The sectional views 10a and 10b slightly differ from each other in that in FIG. 10a electrode strips 202 are embedded in an insulating layer 260 disposed on the upper surface of the sensor device, while in FIG. 10b a transparent electrode 202', for example of indium lead oxide (T10) covers an insulating layer 260' disposed at the upper surface of the sensor device, which ensures that a higher luminous sensitivity is obtained.

The conductive regions being formed in a layer of recrystallized Si (the thickness being of the order of 1 to 2/μm), the strips 240 can be obtained by recrystallization by means of a laser by sweeping in the direction of the charge transfer electrodes. The p+ regions 230 formed by implantation assist in reducing the dark current. The electrodes 1A to 1D may consist of metal or of molybdenum. The dimension of an elementary cell is of the order of 10 to 20/μm parallel to the channels 15 and 5 to 10/μm parallel to the electrodes.

The operation of the sensor is as follows. At the integration stage, the strips 202 (or the electrode 202' as the case may be) are brought to a negative potential. When the electrodes 1C and 1D are at a positive potential and the electrodes 1A and 1B are at a negative potential, the charges traverse the strips 240 and are stored under the electrodes 1C and 1D. When the electrodes 1A and 1B are at a positive potential and the electrodes 1C and 1D are at a negative potential, the charges traverse the strips 240 and are stored under the electrodes 1A and 1B. The charges stored under the strips 240 situated between the electrodes 1B and 1C and under the strips 240 situated between the electrodes 1D and 1A are drift in opposite directions (interlacing). At the charge transfer stage, the strips 202 (or as the case may be the electrode 202') are brought to a positive potential, which renders it possible that they attract temporarily the free charge carriers and that the blooming effect is avoided.

The invention is not limited to the embodiments described and illustrated. The removal of the free charge carriers and the separation between the electrons of one cell and another may also be obtained by means of conductive strips of the second conductivity type forming a bi-dimensional network enclosing the elementary cells. Another possibility is to have insulating strips adjoining the elementary cells in one direction and conductive strips adjoining the elementary cells in the other direction.

What is claimed is:

1. An image sensor device of the frame transfer type, comprising:
    a semiconductor substrate which includes a first region of a first conductivity type, a second region of a second conductivity type overlying said first region, and a plurality of substantially parallel, longitudinally extending charge transfer channels of the first conductivity type arranged in said second region, said channels being aligned with a desired direction of charge transfer; and
    an arrangement of charge transfer electrodes overlying a surface of said second region, which electrodes serve to transfer electrical charges of a first type along said substantially parallel channels when suitable voltages are applied thereto, Characterized In That
    said device further comprises a network of electrically insulating separation strips (24) which overlie said arrangement of charge transfer electrodes (1A, 1B, 1C, 1D), a photosensitive structure (50) which overlies both said separation strips and said second region, said structure (50) including conductive strips (30) of the second conductivity type which overlies said separation strips (24), said separation strips (24) serving to outline a plurality of window regions (100, 101, 200, 201) in said structure (50) and said conductive strips (30) serving to at least partially separate said window regions, said device including a plurality of elementary cells each of which includes at least one such window region, said structure (50) also including charge transfer windows (40, 240) extending from said window regions (100, 101, 200, 201) to said substantially parallel channels, each elementary cell of said device including at least one charge transfer window to provide an electrical connection between the corresponding window region of the elementary cell and a charge transfer channel.

2. A device as claimed in claim 1, characterized in that said photosensitive structure (50) includes a photosensitive layer, and each of said charge transfer windows (40, 240) includes a region of said photosensitive layer which extends to a charge transfer channel.

3. A device as claimed in claim 1, characterized in that the arrangement of windows comprises per elementary cell at least one window (40) provided through at least one electrode of the arrangement of electrodes.

4. A device as claimed in claim 3, characterized in that it is of the interlacing type and in that the arrangement of electrodes (1A, 1B, 1C, 1D) has two windows (40) for each elementary cell, which are located on two non-adjacent charge transfer electrodes (1B, 1D) and separated by at least one charge transfer electrode (1A, 1C).

5. A device as claimed in claim 1, characterized in that the arrangement of windows has strips (240) parallel to the charge transfer electrodes of the arrangement of electrodes, each strip (240) of the arrangement of windows being disposed in a space between two charge transfer electrodes (1B, 1C; 1B, 1A) and the said strips (240) being interrupted between the elementary cells by the said separation strips (230) which are parallel to the direction of charge transfer.

6. A device as claimed in claim 1, characterized in that the photosensitive structure (50) is constituted by a layer of doped recrystallized Si, the substrate also consisting of Si.

7. A device as claimed in claim 6, characterized in that the layer of doped recrystallized Si is of the first conductivity type and in that the prolonged parts (40) are also made of doped recrystallized Si of the first conductivity type and have the same doping.

8. A device as claimed in claim 6, characterized in that the layer of doped recrystallized Si is of the second conductivity type and in that the prolonged parts (40) are also made of doped recrystallized Si of the second conductivity type, but have a higher doping.

9. A device as claimed in claim 7, characterized in that the first conductivity type in the n-type and in that the doping of the layer of doped recrystallized Si and of the prolonged parts (40) is $5 \cdot 10^{15}$ at/cm$^3$, and in that the charge transfer channels (15) have a doping lying between 1 and $4 \cdot 10^{16}$ at/cm$^3$.

10. A device as claimed in claim 8, characterized in that the first conductivity type is the n-type, and in that the doping of the layer of doped recrystallized Si is $5 \cdot 10^{15}$ at/cm$^3$, while the doping of the prolonged parts (40) is $2 \cdot 10^{16}$ at/cm$^3$, and in that the charge transfer channels (15) have a doping lying between 1 and $4 \cdot 10^{16}$ at/cm$^3$.

11. A device as claimed in claim 1, characterized in that at least one upper electrode (2) is superimposed on the arrangement of charge transfer electrodes (1A, 1B, 1C, 1D) and is insulated from the charge transfer electrodes in such a manner that the image smear is reduced when it is brought to a first potential of the first sign during an image integration and to a second potential of the second sign during a charge transfer stage.

12. A device as claimed in claim 11, characterized in that the said upper electrode (2) is reflective.

13. A device as claimed in claim 12, characterized in that non-transparent islands (42) projecting slightly from the said contact zones are arranged at the surface (51) of the photosensitive structure (50) and at right angles to the windows (40, 240).

14. A device as claimed in claim 1, characterized in that it comprises a transparent electrode (2', 202') arranged on at least a part of the surface of the photosensitive structure (50, 230, 250) and electrically insulated therefrom so as to reduce the image smear when it is brought to a first potential of the first sign at an image integration stage and to a second potential of the second sign opposite to the first sign at a charge transfer stage.

15. A device as claimed in claim 14, characterized in that the charge transfer electrodes (1A, 1B, 1C, 1D) are reflective.

16. A device as claimed in claim 14, characterized in that there is arranged between the photosensitive structure (50) and the arrangement of electrodes (1A, 1B, 1C, 1D) so as to be electrically insulated therefrom at each window region (100, 101, 200, 201) a conductive reflecting region (70) in electrical contact with the corresponding window region (100, 101, 200, 201), the conductive regions (70) being separated from each other along a network of separation strips.

17. A device as claimed in claim 16, characterized in that reflective lines (71) are arranged at right angles to the separation strips.

18. A device as claimed in claim 17, characterized in that the reflective lines (71) are arranged under the separation strips and are embedded in an insulating material.

19. A device as claimed in claim 5, characterized in that it comprises electrode strips (202) arranged at right angles to the strips (240) of the arrangement of windows so as to reduce the image smear when they are brought to a first potential of a first sign at an image integration stage and to a second potential of a second sign opposite to the first sign at a charge transfer stage.

20. A device as claimed in claim 19, characterized in that the electrode strips are non-transparent.

* * * * *